United States Patent
Tihanyi et al.

(10) Patent No.: US 6,628,491 B1
(45) Date of Patent: Sep. 30, 2003

(54) SEMICONDUCTOR COMPONENT WITH A CIRCUIT FOR DRIVING AN ELECTRICAL LOAD

(75) Inventors: Jenoe Tihanyi, Kirchheim (DE); Peter Sommer, München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/357,248

(22) Filed: Jul. 20, 1999

(30) Foreign Application Priority Data

Jul. 20, 1998 (DE) .......................... 198 32 558

(51) Int. Cl.[7] .............................................. H02H 5/04
(52) U.S. Cl. ...................................... 361/93.8; 361/103
(58) Field of Search .......................... 361/93.1, 93.8, 361/103, 106, 100, 23, 25, 24, 27

(56) References Cited

U.S. PATENT DOCUMENTS

| | | | | |
|---|---|---|---|---|
| 3,651,379 A | * | 3/1972 | Moisand et al. | 317/41 |
| 5,101,315 A | * | 3/1992 | Ishikawa et al. | 361/24 |
| 5,115,371 A | | 5/1992 | Tripodi | |
| 5,187,632 A | | 2/1993 | Blessing | |
| 5,231,848 A | * | 8/1993 | Farr | 62/229 |
| 5,563,760 A | * | 10/1996 | Lowis et al. | 361/103 |
| 5,886,515 A | * | 3/1999 | Kelly | 323/313 |
| 6,066,221 A | * | 5/2000 | Tihanyi | 361/103 |

FOREIGN PATENT DOCUMENTS

| | | | | |
|---|---|---|---|---|
| DE | | 41 22 653 C2 | 1/1993 | |
| DE | | WO98/12815 | * 3/1998 | ......... H03K/17/082 |

OTHER PUBLICATIONS

J. Tihanyi: "Smart SIPMOS Technology", Siemens Forschungs–und Entwicklungs–Beratung, vol. 17, No. 1, 1988, pp. 35–42.
B. Murari et al.: "Smart Power ICs", Smart Discrete Technologies, Springer Publishers, pp. 85–97.
Europa Fachbuchreihe "Elektronik", second chapter, third edition, pp. 79–80.

* cited by examiner

*Primary Examiner*—Kim Huynh
(74) *Attorney, Agent, or Firm*—Laurence A. Greenberg; Werner H. Stemer; Gregory L. Mayback

(57) ABSTRACT

The semiconductor component has a circuit configuration for driving an electrical load. The circuit includes a control circuit with a power switch driven by a drive configuration and feeding a current to the load. The semiconductor component has a first temperature detector thermally closely coupled to the power switch and a further temperature detector. A temperature evaluation circuit receives temperature signal from the temperature detectors and generates a signal that depends on the signals of the temperature detectors and feeds the signal to the drive configuration.

13 Claims, 3 Drawing Sheets

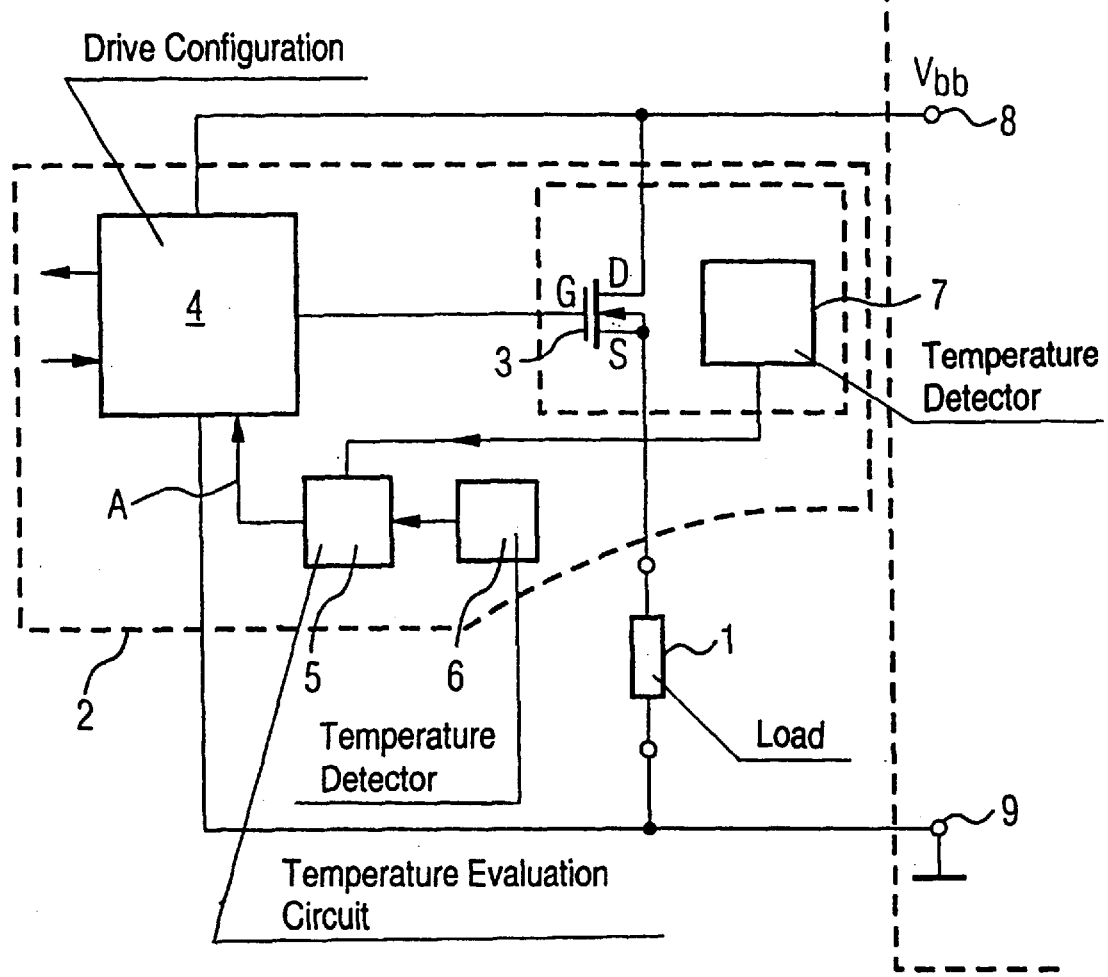

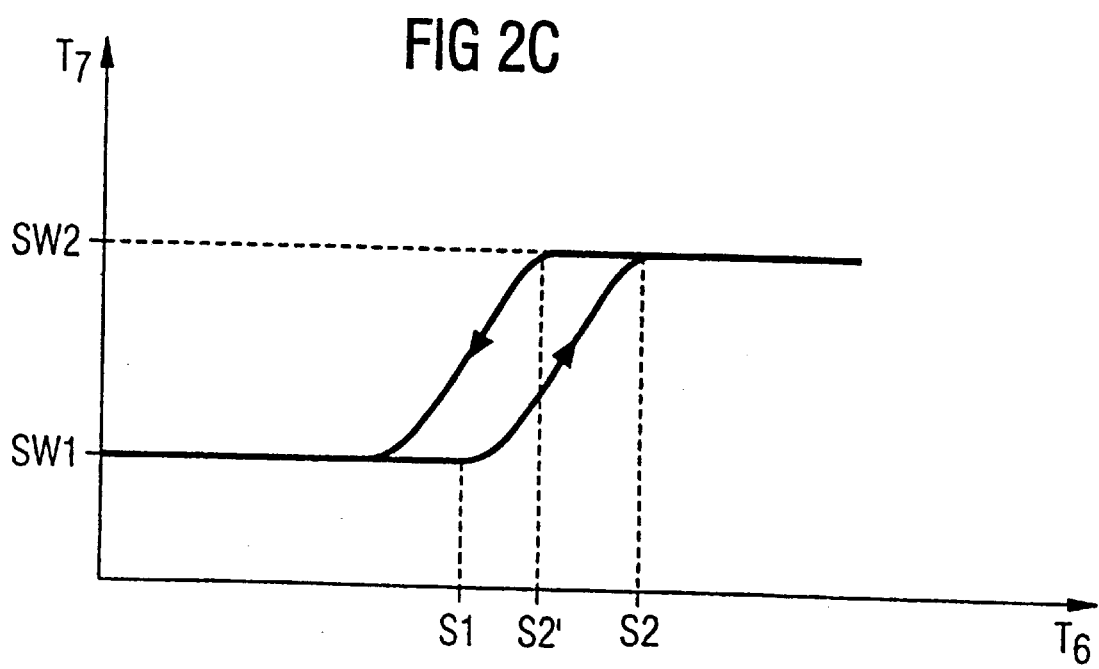

SEMICONDUCTOR COMPONENT WITH A CIRCUIT FOR DRIVING AN ELECTRICAL LOAD

BACKGROUND OF THE INVENTION

Field of the Invention

The invention relates to a semiconductor component with a circuit configuration for driving an electrical load, with a control circuit having at least one power switch and a drive configuration, which drives the at least one power switch and via which current is supplied to the load. Furthermore, the circuit configuration has a temperature evaluation circuit which is intended to protect the control circuit and/or the load against overheating.

Power switches which are used to switch loads, e.g. DC motors, asynchronous motors or the like, must have protection against short circuits in the load circuit. This is necessary because otherwise the power switch or, in the worst case, even the load could be destroyed.

For this purpose, the power switches are provided, for example, with one or more temperature sensors whose signals are evaluated by an evaluation circuit. The power switch is switched off upon the occurrence of a short circuit that results in a substantial temperature increase in the power switch. If a specific temperature value is exceeded, the power switch is switched off and destruction is consequently prevented.

The publication "Smart Power ICs, Technologies and Applications," Morari, Bertotti, Vignola (Eds.), Springer Verlag 1996, p. 85ff., describes power switches which have a sensor for their protection. For this purpose, a sensor chip is bonded on the semiconductor chip of the power switch. The sensor chip is electrically connected to the power switch. The connection is effected between the gate electrode of the power switch and the source electrode. The sensor chip is thereby designed as a thyristor which responds at a predetermined temperature of 150° C. and switches off the power switch when this temperature limit is exceeded. Consequently, the sensor chip is connected to the power switch in a readily thermally conductive manner.

Furthermore, power switches are known in which a diode or a transistor sensor is integrated in the vicinity of the hottest location in the power switch. The signal of the sensor is then processed by an evaluation circuit in such a way that the power switch is switched off or at the very least power reduction is effected as soon as the temperature at the sensor exceeds a predetermined threshold. The switching thresholds normally lie between 150° C. and 180° C.

Despite close thermal coupling between the power switch and the sensor, the actual temperature present at the power switch is present somewhat later at the sensor on account of thermal inertia. This means that the sensor reacts in a somewhat delayed manner. This temporal, delayed response of the sensor is all the more pronounced the lower the temperatures of the housing surrounding the semiconductor component are. It is possible, therefore, for the semiconductor component to be destroyed at low housing temperatures e.g. in the event of a high short-circuit power, while at higher housing temperatures the sensor can still switch off the power switch in good time or reduce the power. The housing temperature is greatly influenced by the ambient temperature.

SUMMARY OF THE INVENTION

It is accordingly an object of the invention to provide a semiconductor component with a circuit configuration for switching an electrical load, which overcomes the above-mentioned disadvantages of the heretofore-known devices and methods of this general type and which affords improved protection against destruction.

With the foregoing and other objects in view there is provided, in accordance with the invention, a semiconductor component with a circuit configuration for driving an electrical load, comprising a control circuit with at least one power switch connected to an electrical load for supplying current to the electrical load and having a drive configuration connected to and driving the power switch. The semiconductor component having a first temperature detector thermally closely coupled to the power switch and outputting a first temperature signal representing a temperature at the power switch and a second temperature detector outputting a second temperature signal. A temperature evaluation circuit is connected to the first and second temperature detectors and to the drive configuration for generating an output signal from the first and second temperature signals and feeding the output signal to the drive configuration.

In accordance with an added feature of the invention, the second temperature detector is disposed to sense an ambient temperature and the second temperature signal is dependent on surroundings of the semiconductor component.

In accordance with an additional feature of the invention, a housing encloses the control circuit and the second signal depends on a housing temperature.

In accordance with another feature of the invention, a lead frame carries the circuit configuration, and the second temperature detector supplies the second temperature signal dependent on a lead frame temperature.

In other words, the invention proposes a semiconductor component having a circuit configuration for driving an electrical load, with a control circuit comprising at least one power switch with a drive configuration. A current can be fed to the load via said control circuit. Furthermore, the semiconductor component has at least one temperature detector, which is thermally closely coupled to the power switch, and also a temperature evaluation circuit, which controls the power switch in a manner dependent on the signal of the thermally closely coupled temperature detector. The concept on which the invention is based consists in the semiconductor component having a further temperature detector, in which case the temperature evaluation circuit generates an output signal, which is dependent on the temperature of the thermally closely coupled temperature detector and the further temperature detector, and feeds said signal to the drive configuration.

The temperature sensor of the first temperature detector which is thermally closely coupled to the power switch may be, for example, a thyristor, a flip-flop or any other desired logic circuit. The temperature detector which is thermally closely coupled to the power switch may in this case be designed as a separate semiconductor chip which is applied to the power switch via an insulating layer having good thermal conductivity. However, it is also conceivable for the temperature detector which is thermally closely coupled to the power switch and the power switch to be monolithically integrated. The advantage consists in the fact that the power switch and the temperature detector can be produced in a single fabrication stage and optimum emplacement of the temperature detector in the power switch is possible.

The further temperature detector of the invention generates a signal which is dependent on the surroundings and is supplied to the temperature evaluation circuit. The effect achieved as a result of this is that the ambient temperature, which influences the point in time at which the drive configuration responds, can concomitantly be taken into account. In another refinement, the further temperature detector supplies a signal which is dependent on the housing temperature. In a further refinement, the further temperature detector supplies a signal which is dependent on the lead frame temperature. The effect whereby the surroundings of the semiconductor component are taken into account is achieved as a result of these refinements, too.

If the semiconductor component is operated in very cold surroundings, then the housing or lead frame temperature is likewise low. This low temperature affects the temperature detector which is thermally closely coupled to the power switch. If a short circuit occurs in the load circuit, then the power switch is heated very rapidly. Since the temperature detector which is thermally closely coupled to the power switch follows the heating of the power switch with a degree of inertia, this delay time is prolonged by the low housing temperature. Damage to the power switch or even to the load could occur. On account of the further temperature detector which takes account of the ambient temperature or the housing/lead frame temperature, the temperature threshold in the temperature evaluation circuit is influenced in such a way that in the case of a low signal value of the further temperature detector, the power switch is switched off or has its power reduced at a lower temperature of the temperature detector which is thermally closely coupled to the power switch. If, on the other hand, the semiconductor component is operated at a high ambient temperature, then the temperature detector which is thermally closely coupled to the power switch can respond more rapidly, and the power switch can thus be switched off at a higher temperature threshold.

In accordance with a further feature of the invention, the second temperature signal assumes temperature values including a first signal value and a second signal value, and the drive configuration is adapted to control the power switch in dependence on the second temperature signal such that a first switching threshold is critical up to the first signal value and a second switching threshold is critical above the second signal value, wherein the first switching threshold is lower than the second switching threshold.

In other words, the semiconductor component is set up so that the drive configuration controls the power switch in dependence on the signal of the second temperature detector in such a way that a first switching threshold is critical up to a first signal value and that a second switching threshold is critical above a second signal value. In this case, the first switching threshold is smaller than the second switching threshold. This means nothing more than that the drive configuration controls the power switch in such a way that, depending on the further temperature detector (e.g. ambient temperature), in the case of a low signal value the switch-off threshold assumes a low value, whereas, in the case of a high signal value of the further temperature detector, the power switch is switched off only at a higher value of the temperature detector which is thermally closely coupled to the power switch.

In accordance with again an added feature of the invention, the first signal value is less than the second signal value, or in the alternative, it is equal to the second signal value.

In the first embodiment, the first signal value is in this case less than the second signal value. This means that if the semiconductor component is operated at a low temperature determined by the further temperature detector, up to a first signal value the power switch is switched off at a low switching threshold (temperature of the temperature detector which is thermally closely coupled to the power switch). If the temperature of the further temperature detector exceeds this first signal value, then the switching threshold is moved upward linearly with the increase in this temperature signal. When a second signal value is reached, which is greater than the first signal value (a greater temperature than the temperature of the first signal value), the power switch is switched off at a second switching threshold, which is higher than the first switching threshold.

In the second embodiment, the first signal value is equal to the second signal value. This means that until a specific limit temperature of the further temperature detector is reached, the power switch is switched off at a low switching threshold, so that it is then switched off at a second higher switching threshold of the temperature detector which is thermally closely coupled to the power switch when the first signal value is exceeded.

The advantage of operating the power switch in a manner dependent on a temperature signal which is closely coupled to the power switch and at the same time on a further temperature signal which takes account of the external ambient influences on the power switch consists in the fact that the short-circuit strength is ensured even at cold ambient temperatures. At the same time, however, it is ensured that the semiconductor component functions fully even at high ambient temperatures. The power switch and the load operated by it thus have improved endurance to withstand failure.

In accordance with a concomitant feature of the invention power switch and the first temperature detector are monolithically integrated. Also, the drive configuration and the evaluation circuit may be monolithically integrated.

Other features which are considered as characteristic for the invention are set forth in the appended claims.

Although the invention is illustrated and described herein as embodied in a semiconductor component with a circuit for driving an electrical load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic block diagram illustrating the basic circuit configuration of the semiconductor component according to the invention.

FIG. 2C shows a hysteresis profile of the switch-off threshold of the power switch as a function of the first and second temperature detectors.

DESCRIPTION OF THE PREFERRED EMBODIMENTS

Figure 2A:
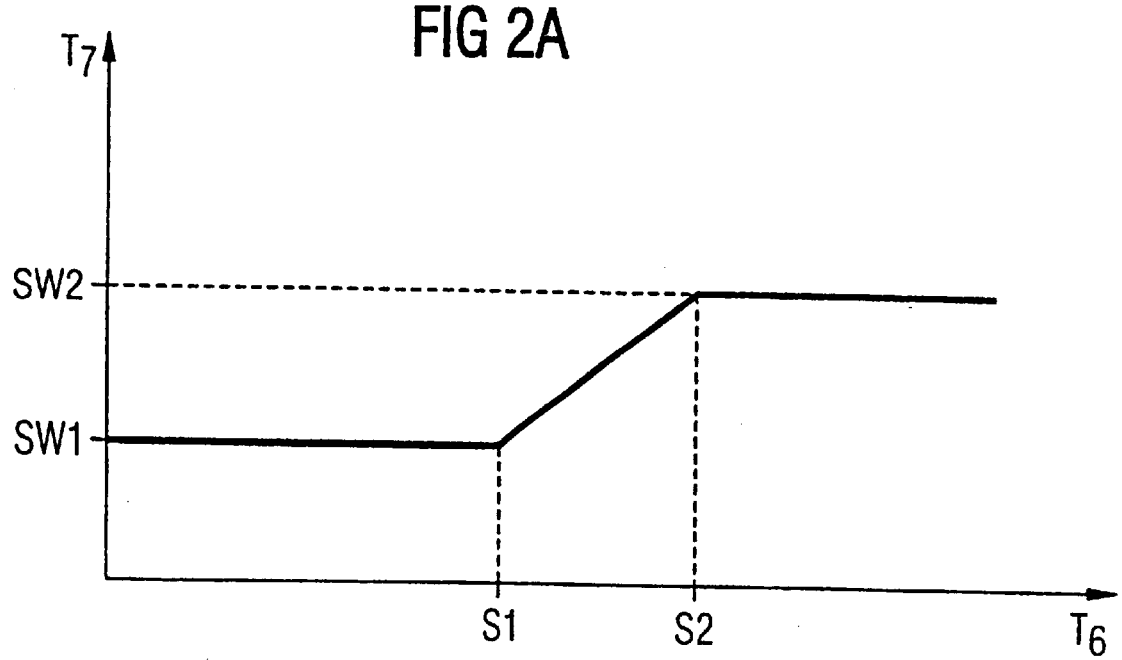
FIG. 2A shows a ramp-shaped profile of the switch-off threshold of the power switch as a function of the first and second temperature detectors.

Referring now to the figures of the drawing in detail and first, particularly, to FIG. 1 thereof, there is seen a basic diagram of the semiconductor component according to the invention. The circuit configuration includes a power supply with a first supply terminal 8 and a second supply terminal 9. The second supply terminal 9 is at a fixed potential, for instance ground. The circuit configuration furthermore has a control circuit 2, which is connected to the first supply terminal 8 and to the second supply terminal 9. A load 1 is connected between the control circuit 2 and the second supply terminal 9. The load 1 may be a DC motor, an asynchronous motor, a lamp or any other desired load. The control circuit 2 has a power switch 3, which is implemented as a MOSFET in the illustrated embodiment. The MOSFET 3 has a gate electrode G, a drain electrode D, and a source electrode S. One terminal of the load 1 is connected to the source electrode S. The drain electrode D of the power switch 3 is connected to the first supply terminal 8. The gate terminal G of the power switch 3 is connected to a drive configuration 4. The drive configuration 4 comprises a charge pump, which generates a positive voltage that is higher than the voltage present at the first supply terminal 8. The drive configuration 4 is connected between the first supply terminal 8 and the second supply terminal 9. The arrangement illustrated constitutes a so-called high side switch. However, the invention can also be embodied as a so-called low side switch.

Furthermore, the circuit configuration has a temperature detector 7, which is closely thermally coupled to the power switch 3. The temperature detector 7 and the power switch 3 may in this case integrated on the same semiconductor chip, as suggest in FIG. 1 by the dotted box enclosing the power switch 3 and the temperature detector 7. However, a discrete arrangement is also conceivable in that the temperature detector 7 (separate semiconductor chip) is applied to the semiconductor chip of the power switch 3 by means of an insulating layer and, at the same time, has good thermal coupling. In other words, the temperature sensor 7 is directly connected to the power switch 3, with the intermediary of an insulation. The temperature detector 7 supplies a signal which is dependent on the temperature of the power switch 3 and is supplied to a temperature evaluation circuit 5. The temperature evaluation circuit 5 is furthermore connected to the drive configuration 4 in order to switch off the power switch 3 or else to reduce the power when a specific, set threshold value is exceeded. Furthermore, the circuit configuration has a further temperature detector 6, which is likewise connected to the temperature evaluation circuit 5. The drive configuration 4 and also the temperature evaluation circuit 5 may likewise be embodied in a monolithically integrated manner. Integration with the power switch 3 and the temperature detector 7 on the same substrate is conceivable.

The drive configuration 4 has further inputs and outputs which, by way of example, can supply a signal which is dependent on the status of the power switch 3 to a logic circuit.

The entire control circuit 2 is provided on a lead frame. The entire arrangement is surrounded and enclosed by an encapsulating housing, which is made, for instance, of a molding compound. The dashed line indicating the control circuit 2 may thus also be considered a diagrammatic illustration of the housing.

The temperature detector 6 supplies a signal which is dependent on the housing temperature or the lead frame temperature to the temperature evaluation circuit 5. Therefore, the temperature detector 6 is either incorporated into the encapsulating housing compound or else fixed on the lead frame. In a refinement in which the temperature detector 6 supplies a temperature signal which is dependent on the surroundings to the temperature evaluation circuit 5, the temperature detector 6 is led out from the enclosure housing (2), so as to be exposed to ambient temperature.

The temperature evaluation circuit 5 supplies a signal to the drive configuration 4 which is dependent on the signals of the temperature detector 7, which is closely thermally coupled to the power switch 3, and also of the temperature detector 6, which supplies a signal which is approximately dependent on the temperature of the surroundings.

Figure 2B:
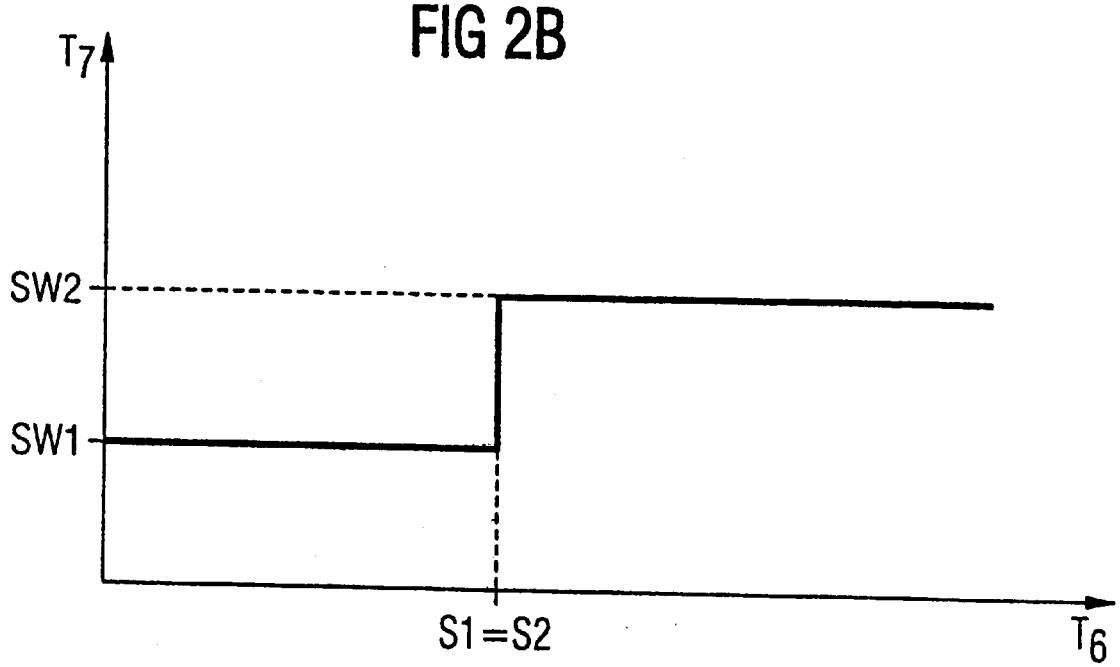
FIG. 2B shows a step-shaped profile of the switch-off threshold of the power switch as a function of the first and second temperature detectors.

Referring now to FIGS. 2A–2C, there is shown the fundamental profile of the switch-off threshold of the power switch 3 as a function of the temperature signals of the temperature detectors 6 and 7. In each case, the temperature signal of the temperature detector 7, that is to say of the temperature detector which is thermally closely coupled to the power switch 3, is illustrated with the temperature signal of the temperature detector 6 (e.g. ambient temperature).

FIG. 2A, the profile of the switch-off threshold of the power switch 3 is stored in a ramp-shaped form in the temperature evaluation circuit 5. Up to a first signal value S1, which lies for example in the temperature range below +50° C., the power switch 3 is switched off at a first switching threshold SW1. The first switching threshold SW1 in this case constitutes the lower switch-off threshold for the signal originating from the temperature detector 7 which is thermally closely coupled to the power switch 3. The value of the first switching threshold SW1 may in this case be approximately 150° C. If the temperature detector 6 supplies a signal which lies above a second signal value S2 (e.g. above 100° Celsius), then the power switch 3 is switched off at a second switching threshold SW2, which is higher than the first switching threshold SW1. In this case, the second switching threshold SW2 may lie in a range around 180° C. If the temperature detector 6 supplies a signal value lying between the first and second signal values S1, S2, then the switch-off threshold of the power switch 3 lies between the first and second switching thresholds SW1, SW2. The advantage of this evaluation consists in the fact that at a low ambient temperature T6, the power switch is already switched off at a relatively small temperature of the temperature detector 7. The longer reaction time of the temperature detector 7 dictated by the low ambient temperature can be compensated for by this procedure. Depending on the field of application of the semiconductor component, the short-circuit strength can be ensured irrespective of the external ambient conditions by an appropriate selection of the first and second signal values S1, S2 and also of the first and second switching thresholds SW1, SW2.

FIG. 2B illustrates a further profile of the switch-off threshold of the power switch 3. Below a first signal value the power switch 3 is switched off when the first switching threshold SW1 is exceeded. If the signal of the temperature detector 6 exceeds the first signal value, which is equal to the second signal value, then the power switch 3 is switched off by means of the drive configuration 4 when a second switching threshold SW2 is exceeded, the second switching threshold again being greater than the first switching threshold SW1. The switch-off threshold assumes a stepped profile in this case.

In FIG. 2C, the switch-off threshold of the power switch 3 assumes the profile of a hysteresis. This profile additionally fulfills the protection with regard to a defect both of the power switch and of the load.

It will be understood by those skilled in the art that the profiles of the switch-off threshold of the power switch which are illustrated in FIGS. 2A–2C are not limited to the forms shown. Rather, the switch-off threshold, above all the profile between the signal values S1 and S2, can be varied in any form which is suitable for the intended purpose for which the semiconductor component is used.

The combination of the signals supplied by the temperature detector 6 and the temperature detector 7 is performed by the temperature evaluation circuit 5. The latter supplies an output signal A to the drive configuration 4, which ensures that the power switch 3 is either switched off or else has its power reduced.

It is also conceivable, of course, for the power switch 3 to have more than the one temperature detector 7 which is thermally closely coupled to it as shown in FIG. 1.

We claim:

1. A semiconductor component with a circuit configuration for driving an electrical load, comprising:
   a control circuit having at least one power switch;
   a first temperature detector thermally closely coupled to said power switch and outputting a first temperature signal representing a temperature at said power switch;
   a second temperature detector outputting a second temperature signal; and
   a temperature evaluation circuit connected to said first and second temperature detectors, said temperature evaluation circuit generating a switch signal if a switching threshold has been reached by the first temperature signal, said switching threshold being dependent on the second temperature signal according to a desired profile.

2. The semiconductor component according to claim 1, wherein said second temperature signal is dependent on surroundings of the semiconductor component.

3. The semiconductor component according to claim 1, wherein the second temperature signal assumes temperature values including a first signal value and a second signal value, said temperature evaluation circuit generates the switch signal when the second temperature signal assumes the first signal value and the first signal has reached a first switching threshold value and when the second temperature signal assumes the second signal value and said second signal has reached a second switching threshold value, wherein the first switching threshold is lower than the second switching threshold.

4. The semiconductor component according to claim 3, wherein the first signal value is less than the second signal value.

5. The semiconductor component according to claim 3, wherein the first signal value is equal to the second signal value.

6. The semiconductor component according to claim 3, wherein the second temperature signal assumes a temperature value between the first signal value and the second signal value and the switching threshold for the switch signal generated by said temperature evaluation circuit assumes a value between the first switching threshold value and the second switching threshold value.

7. The semiconductor component according to claim 1, wherein said power switch and said first temperature detector are monolithically integrated on a semiconductor chip.

8. The semiconductor component according to claim 7, wherein said drive configuration and said evaluation circuit are integrated on one semiconductor chip.

9. The semiconductor component according to claim 1, including a drive configuration for controlling said power switch according to signals generated by said temperature evaluation circuit.

10. The semiconductor component according to claim 1, wherein said desired profile is stored in said temperature evaluation circuit.

11. The semiconductor component according to claim 1, wherein said desired profile of the switching threshold has a ramp-shaped form, as a function of said first temperature signal and said second temperature signal.

12. The semiconductor component according to claim 1, wherein said desired profile of the switching threshold has a stepped form, as a function of said first temperature signal and said second temperature signal.

13. The semiconductor component according to claim 1, wherein said desired profile of the switching threshold is a hysteresis, as a function of said first temperature signal and said second temperature signal.

* * * * *